US010068847B2

(12) United States Patent
Chen et al.

(10) Patent No.: US 10,068,847 B2
(45) Date of Patent: Sep. 4, 2018

(54) PACKAGE SUBSTRATE AND METHOD OF FABRICATING THE SAME

(71) Applicants:Industrial Technology Research Institute, Hsinchu (TW); Unimicron Technology Corp., Taoyuan (TW)

(72) Inventors: Yu-Hua Chen, Hsinchu (TW); Wei-Chung Lo, Hsinchu (TW); Dyi-Chung Hu, Taoyuan (TW); Chang-Hong Hsieh, Taoyuan (TW)

(73) Assignees: Industrial Technology Research Institute, Hsinchu (TW); Unimicron Technology Corp., Taoyuan (TW)

( * ) Notice: Subject to any disclaimer, the term of this patent is extended or adjusted under 35 U.S.C. 154(b) by 0 days.

(21) Appl. No.: 15/468,087

(22) Filed: Mar. 23, 2017

(65) Prior Publication Data

US 2017/0194249 A1     Jul. 6, 2017

Related U.S. Application Data

(62) Division of application No. 13/965,842, filed on Aug. 13, 2013.

(30) Foreign Application Priority Data

Sep. 26, 2012   (TW) .............................. 101135246 A

(51) Int. Cl.
*H01L 29/00* (2006.01)
*H01L 23/522* (2006.01)
*H01L 23/498* (2006.01)
*H01L 21/48* (2006.01)
*H01L 25/04* (2014.01)

(52) U.S. Cl.
CPC ...... *H01L 23/5226* (2013.01); *H01L 21/4857* (2013.01); *H01L 23/49833* (2013.01); *H01L 23/49838* (2013.01); *H01L 25/04* (2013.01)

(58) Field of Classification Search
CPC ............. H01L 23/5226; H01L 21/4857; H01L 23/49833; H01L 23/49838; H01L 25/04
See application file for complete search history.

(56) References Cited

U.S. PATENT DOCUMENTS

| 8,269,337 | B2 * | 9/2012 | Hu ........................ H01L 23/36 257/698 |
| 2004/0056344 | A1 * | 3/2004 | Ogawa ................ H01L 21/6835 257/686 |

* cited by examiner

*Primary Examiner* — Victor A Mandala
*Assistant Examiner* — Colleen E Snow
(74) *Attorney, Agent, or Firm* — JCIPRNET

(57) ABSTRACT

A package substrate and a method of fabricating the package substrate are provided. The package substrate includes a substrate having a first surface including a plurality of conductive pads and a second surface; an insulating protective layer formed on the first surface of the substrate; an interposer embedded in and exposed from the insulating protective layer; and at least a passive component provided on the first surface of the substrate. The insulating protective layer includes at least an opening for exposing at least one of the conductive pads, and the at least the passive component is directly provided on the conductive pad exposed from the opening.

4 Claims, 3 Drawing Sheets

PACKAGE SUBSTRATE AND METHOD OF FABRICATING THE SAME

CROSS-REFERENCE TO RELATED APPLICATIONS

This application is a divisional application of and claims the priority benefit of U.S. application Ser. No. 13/965,842, filed on Aug. 13, 2013, now abandoned, which claims the priority benefit of Taiwan application serial no. 101135246, filed on Sep. 26, 2012. The entirety of each of the above-mentioned patent applications is hereby incorporated by reference herein and made a part of specification.

BACKGROUND

1. Technical Field

The present disclosure relates to package substrates and methods of fabricating the same, and relates to a package substrate having an embedded interposer and a method of fabricating the same.

2. Description of Related Art

With the rapid development of the electronics industry, electronic products are becoming more and more compact, and the directions for research and development of their functions are moving towards high performance, multi-function, and high speed, resulting in increasing wiring density of semiconductor chips in the scale of nanometer. Therefore, package substrates for carrying the chips (such as flip-chip carriers) can no longer meet the demands for high wiring density of the semiconductor chips, thus a so-called 3D-SiP (System-in-package) packaging process is developed in the industry.

SUMMARY

The present disclosure provides a package substrate that integrates an interposer and passive components. The package substrate may include: a substrate with wirings, a first surface and a second surface opposing the first surface, the first surface including a plurality of conductive pads; an insulating protective layer formed on the first surface of the substrate; an interposer embedded in the insulating protective layer and electrically connected to the substrate, the interposer including a plurality of penetrating conductive vias and a wiring redistribution layer exposed from the insulating protective layer; and at least a passive component provided on the first surface of the substrate.

BRIEF DESCRIPTION OF DRAWINGS

The present disclosure can be more fully understood by reading the following detailed description of the embodiments, with reference made to the accompanying drawings, wherein.

DETAILED DESCRIPTION

Figure 1:
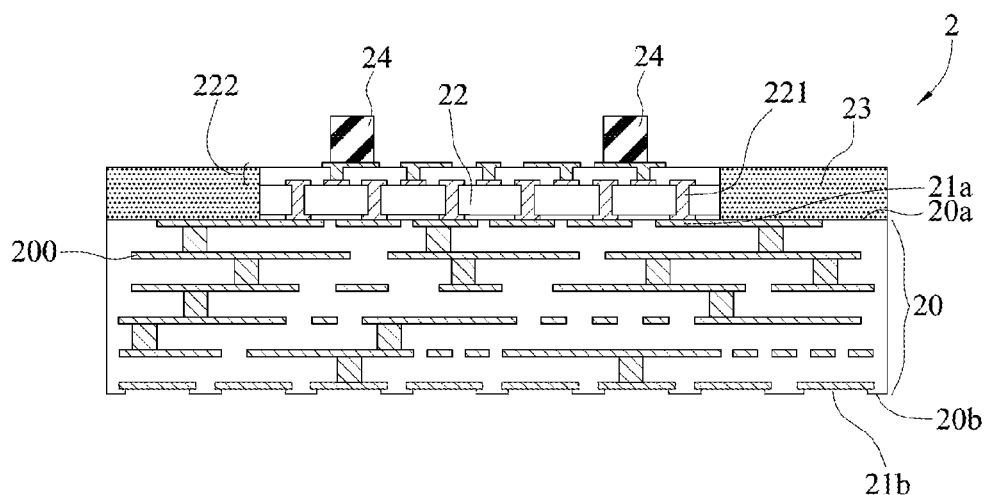
FIG. 1 is a cross-sectional view of a package substrate according to a first embodiment of the present disclosure.

In the following detailed description, for purposes of explanation, numerous specific details are set forth in order to provide a through understanding of the disclosed embodiments. It will be apparent, however, that one or more embodiments may be practiced without these specific details. In other instances, well-known structures and devices are schematically shown in order to simplify the drawing.

It should be noted that the structures, proportions, sizes and the like shown in the attached drawings are to be considered only in conjunction with the contents of this specification to facilitate understanding and reading of those skilled in the art, and are not intended to limit the scope of present disclosure, thus they do not hold any real technically significance, and any changes or modifications in the structures, the proportions, the sizes and the like should fall within the scope of the technical contents disclosed in the present disclosure as long as they do not affect the effects and the objectives achieved by the present disclosure. Meanwhile, terms such as "on", "top", "bottom", "surrounding", "above", "one" or "a" used in this specification are used for ease of illustration only, and not to limit the scope of the present disclosure, any changes or modifications of the relative relationships of elements are therefore to be construed as with the scope of the present disclosure as long as there is no changes to the technical contents.

"Conductive vias" as mentioned herein refers to conductive components formed on a substrate, for example, the interposer herein. As shown in the diagrams, the shape of the conductive vias can be columnar.

First Embodiment

Referring to FIG. 1, a cross-sectional view of a package substrate 2 according to a first embodiment of the present disclosure is shown.

A substrate 20 having wirings 200, a top surface (can be regarded as a first surface) 20a and a bottom surface (can be regarded as a second surface) 20b is provided. In an embodiment, the substrate 20 is a multilayer interconnect base plate. The top surface 20a has a plurality of conductive pads 21a. An interposer 22 and an insulating protective layer 23 are formed on the top surface 20a. The interposer 22 is embedded into the insulating protective layer 23 and exposed from the surface of the insulating protection layer 23. A plurality of passive components 24 are provided on the interposer 22.

In an embodiment, the interposer 22 is a silicon interposer and has a plurality of penetrating conductive vias 221 and a wiring redistribution layer (RDL) 222 exposed from the insulating protective layer 23. The bottom ends of the conductive vias 221 are each connected to conductive pads 21a to electrically connect with the wirings 200, and the passive components 24 are arranged on the wiring redistribution layer 222 to be electrically connected with the interposer 22.

By disposing the passive components 24 on the wiring redistribution layer 222, when an active component (not shown) such as a semiconductor chip is provided on the wiring redistribution layer 222, the active component can be assembled in a way that it is closest to the passive components 24, thereby reducing the distance between the active component and the passive components 24.

Signals are transmitted to the substrate 20 through the wiring redistribution layer 222 and the passive components 24 connected in series, and the conductive vias 221, so that the electrical connection path between the active component and the passive components 24 is made shortest. As a result, the pins of the active component have stable voltage.

Second Embodiment

Figure 2A:
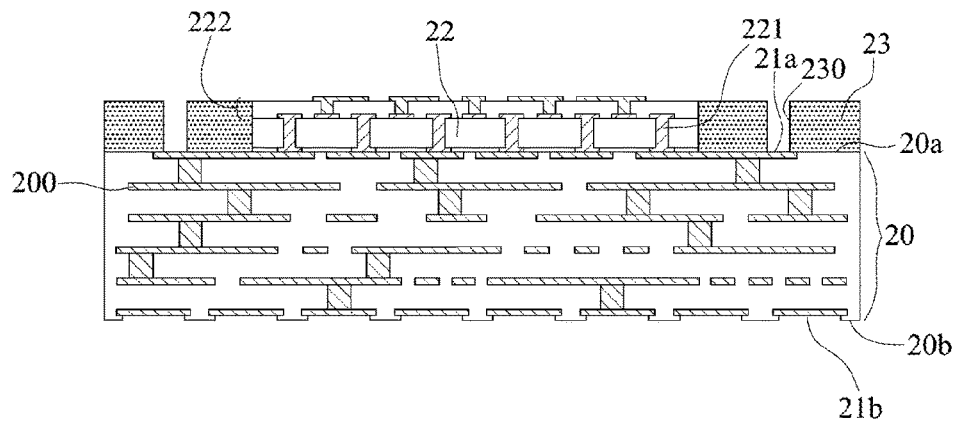
FIGS. 2A to 2C are cross-sectional views of a package substrate according to a second embodiment of the present disclosure.
Figure 2B:
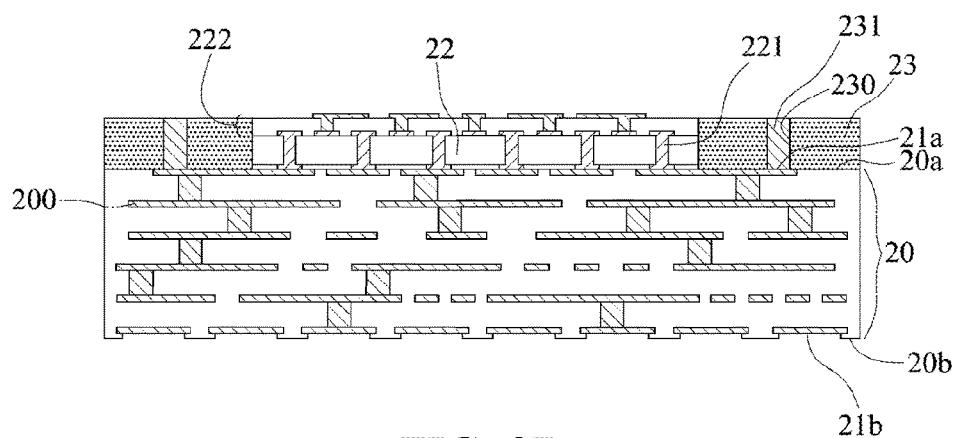
Figure 2C:
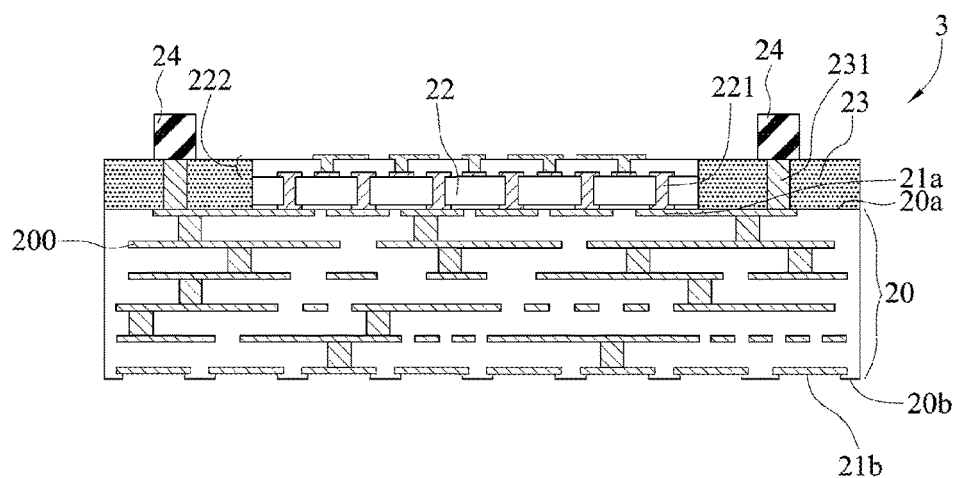

Referring to FIGS. 2A to 2C, cross-sectional views of a package substrate 3 according to a second embodiment of the present disclosure are shown. The second embodiment differs from the first embodiment in the locations and the electrical connection method of the passive components 24.

As shown in FIG. 2A, a plurality of holes 230 are formed in the insulating protective layer 23 at locations corresponding to a portion of the exposed conductive pads 21a by using a fixed-depth mechanical drilling method or a laser drilling method.

As shown in FIG. 2B, conductive components 231 such as columns are formed in the holes 230 by electroplating, printing, plugging or spin-coating techniques.

In an embodiment, the conductive components 231 are made of conductive adhesives or electroplated metals, such as copper paste or silver glue.

As shown in FIG. 2C, the passive components 24 are provided on the conductive components 231. The passive components 24 are electrically connected to the conductive pads 21a through the conductive components 231.

In an embodiment, by providing the passive components 24 on the insulating protective layer 23, an active component (not shown) with a larger size can be provided on the wiring redistribution layer 222. The present disclosure reduces the electrical connection path between the active component and the passive components 24, and allows the voltage of the pins of the active component to be more stable.

Third Embodiment

Figure 3:
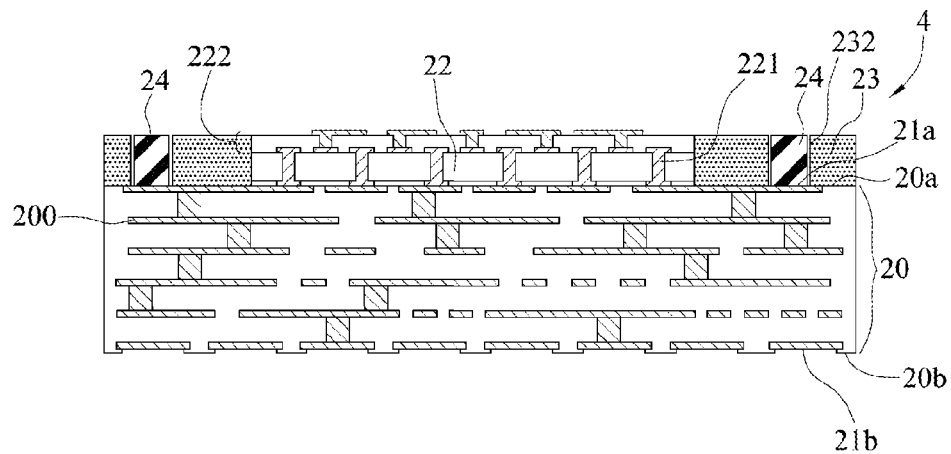
FIG. 3 is a cross-sectional view of a package substrate according to a third embodiment of the present disclosure.

Referring to FIG. 3, a cross-sectional view of a package substrate 4 according to a third embodiment of the present disclosure is shown. The third embodiment differs from the second embodiment in the locations and the electrical connection method of the passive components 24.

As shown in FIG. 3, a plurality of holes 232 are formed in the insulating protective layer 23 at locations corresponding to a portion of the exposed conductive pads 21a by using a fixed-depth mechanical drilling method or a laser drilling method. Then, the passive components 24 are soldered onto the conductive pads 21a in the holes 232 by dispensing, such that the passive components 24 are in contact with and electrically connected to the conductive pads 21a.

In an embodiment, by embedding the passive component 24 in the insulating protective layer 23, the height of the package substrate 4 can be reduced to facilitate product thinning.

Furthermore, when an active component is provided on the wiring redistribution layer 222, the present disclosure reduces the electrical connection path between the active component and the passive components 24, and allows the voltage of the pins of the active component to be more stable.

It should be noted that in the package substrate 2, 3, or 4 of the present disclosure, the wiring redistribution layer 222 of the interposer 22 is used for at least a active component such as a semiconductor chip (not shown) to be disposed, and packaging process is performed to form a semiconductor package.

Figure 4:
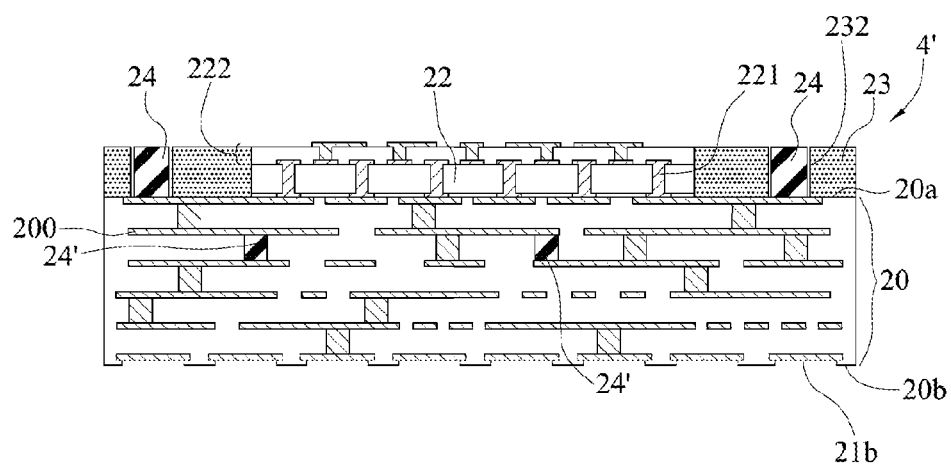
FIG. 4 is a cross-sectional view of a package substrate according to a fourth embodiment of the present disclosure.

In the production of the substrate 20, at least a passive component 24' can be buried in the substrate 20 and electrically connected to the wirings 200, as shown by the package substrate 4' in FIG. 4.

In addition, the bottom surface 20b of the substrate 20 of the present disclosure may also have conductive pads 21b for electrical connection to other electrical devices, such as circuit boards or package structures.

A coreless substrate 20 is used for illustrating the various embodiments described above, a substrate with a core layer can also be applied in the package substrates of the present disclosure, and is deemed to be within the range of the claims of the present disclosure.

In summary, in the package substrate 2, 3, or 4 of the present disclosure, the interposer 22 is integrated with the passive components 24, so when an active component is provided on the interposer 22, the distance between the active component and the passive components 24 is reduced, i.e., the electrical connection path between the active component and the passive components 24 is shortened. Therefore, the voltage of the pins of the active component can be more stable, and the electrical performance of the final electronic product is enhanced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A package substrate, comprising:
   a substrate having a first surface and a second surface opposing to the first surface, the first surface including a plurality of conductive pads;
   an insulating protective layer formed on the first surface of the substrate;
   an interposer embedded in the insulating protective layer and electrically connected to the substrate, the interposer including a plurality of penetrating conductive vias and a wiring redistribution layer, the interposer exposed from the insulating protective layer, wherein the insulating protective layer is the outmost layer above the first surface of the substrate; and
   at least a passive component provided on the first surface of the substrate, wherein the insulating protective layer includes at least an opening for exposing at least one of the conductive pads, and the at least the passive component is directly provided on the conductive pad exposed from the opening, the insulating protective layer is free from covering the wiring redistribution layer and a surface away from the substrate of the passive component.

2. The package substrate of claim 1, further comprising at least another passive component embedded in the substrate.

3. The package substrate of claim 1, wherein a surface of the at least the passive component is aligned with a surface of the insulating protective layer.

4. The package substrate of claim 1, wherein the second surface of the substrate includes a plurality of another conductive pads for electrical connection to other electrical devices.

* * * * *